United States Patent
Behringer et al.

(10) Patent No.: US 6,956,881 B2
(45) Date of Patent: Oct. 18, 2005

(54) STACKED SEMICONDUCTOR LASER DIODE

(75) Inventors: Martin Behringer, Regensburg (DE); Karl Ebeling, Ulm (DE); Thomas Knödl, Munich (DE); Johann Luft, Wolfsegg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/432,187

(22) PCT Filed: Nov. 20, 2001

(86) PCT No.: PCT/DE01/04350

§ 371 (c)(1),
(2), (4) Date: Sep. 25, 2003

(87) PCT Pub. No.: WO02/43204

PCT Pub. Date: May 30, 2002

(65) Prior Publication Data

US 2005/0089073 A1 Apr. 28, 2005

(30) Foreign Application Priority Data

Nov. 21, 2000 (DE) .......................... 100 57 698

(51) Int. Cl.[7] ............... H01S 3/10; H01S 5/00; H01S 3/14

(52) U.S. Cl. ............... 372/43; 372/23; 372/45; 372/50; 372/68

(58) Field of Search ............ 372/23, 43, 45–50, 372/68, 97

(56) References Cited

U.S. PATENT DOCUMENTS 5,212,706 A   5/1993   Jain
5,365,536 A * 11/1994   Seki ........................... 372/45
5,679,963 A   10/1997   Klem et al.
5,715,266 A *  2/1998   Takagi ........................ 372/45
6,133,590 A   10/2000   Ashley et al.

FOREIGN PATENT DOCUMENTS

DE   44 34 345 A1   3/1996
EP   0 803 948 A2   10/1997
JP   08 139404 A    5/1996

OTHER PUBLICATIONS

A.R. Sugg, et al/. "n–p–($p^+$–$n^+$)–n $Al_y Ga_{1-y} As$–GaAs–$In_x Ga_{1-x} As$ quantum–well laser with $p^+$–$n^{+GaAs–InGaAs}$tunnel contact on n–GaAs", Appl. Phys. Lett. vol. 62 (20), pp. 2510–2511, May 1993.

(Continued)

Primary Examiner—Minsun Oh Harvey
Assistant Examiner—Armando Rodriguez
(74) Attorney, Agent, or Firm—Cohen, Pontani, Lieberman & Pavane

(57) ABSTRACT

The present invention relates to an arrangement of semiconductor diode lasers stacked on top of one another, which is arranged on a substrate (1). A first diode laser (12) is arranged on the substrate (1), and a second diode laser (13) is arranged on the first diode laser (12). Between the first diode laser (12) and the second diode laser (13) there is a contact layer (6). The contact layer (6) comprises a first conductive layer (18) of a first conduction type and a second conductive layer (20) of a second conduction type and an interlayer (19) which is arranged between the first and second conductive layers (18, 20).

9 Claims, 3 Drawing Sheets

OTHER PUBLICATIONS

S.G. Patterson, et al., "Continuous–wave room temperature operation of bipolar cascade laser", Electronics Letters, Mar. 4th 1999, vol. 35, No. 5, pp. 395–397.

Takahiro Numai et al., "Proposal on Temperature–Insensitive Semiconductor Lasers", Japanese Journal of Applied Physics, vol. 38, Part I, No. 8, pp. 4764–4767, Aug. 1999.

A.N. Korshak et al., "Tunnel–junction–connected distributed–feedback vertical–cavity surface–emitting laser", Applied Physics Letters, vol. 73, No. 11, pp. 1475–1477 Sep. 14, 1998.

J. Ch. Garcia, et al., "Epitaxially stacked lasers with Esaki junctions: bipolar cascade laser", Applied Physics Letters, 71 (26), pp. 3752–3754, Dec. 29, 1997.

J.K. Kim et al., "Near–Room –Temperature Continuous–Wave Operation of Multiple–Active–Region 1.55 Mum Vertical–Cavity Lasers With High Differential Efficiency", Applied Physics Letters, American Institute of Physics, New York, U.S. Bd. 77, No. 20, pp. 3137–3139, Nov. 2000.

F. Jain et al., "Monolithic Integration of Red, Blue and Green Lasers For Smart Projection Displays", 1995 SID International Symposium Digest of Technical Papers, Orlando, May 23–25, 1995, SID, U.S., Bd. 26, pp. 516–519, May 23, 1995.

* cited by examiner

STACKED SEMICONDUCTOR LASER DIODE

PRIORITY CLAIM

This is a U.S. national stage of application No. PCT/DE01/04350, filed on Nov. 20, 2001.

FIELD OF THE INVENTION

The present invention relates to semiconductor diode lasers stacked on top of one another.

BACKGROUND OF THE INVENTION

High-power diode lasers which emit a high power apply loads to the facets of the individual crystal layers up to the limit range. To increase the power which can be output from a diode laser, it is possible for two diode lasers to be monolithically integrated one above the other. For this purpose, corresponding layers are grown on top of one another. As described in U.S. Pat. No. 5,212,706, the contact between two diode lasers which have been grown on top of one another is produced, for example, by a highly doped tunnel diode which is reverse-biased. The tunnel diode is exposed to extreme levels of load with regard to the current intensity flowing through it and may be destroyed by the loads which are present. A further example of a tunnel contact is given in U.S. Pat. No. 5,679,963.

The laser diodes are usually grown on from a series of layers, it being possible for the individual layers to include different materials and consequently to have different lattice constants. The different lattice constants between adjacent layers lead to stresses, so that elastic energy is stored in the layer stack and forces act between adjacent layers. If the force acting between two layers is too high, lattice dislocations are formed in or between the corresponding layers, which may render the diode lasers unusable.

The object of the invention is to provide an improved contact between two diode lasers arranged one above the other.

SUMMARY OF THE INVENTION

According to the invention, the object set is achieved by an arrangement of semiconductor diode lasers stacked on top of one another, having:
  a substrate on which a first diode laser is arranged;
  a second diode laser, which is arranged on the first diode laser;
  a contact layer which is arranged between the first diode laser and the second diode laser, in which arrangement the contact layer comprises a first conductive layer of a first conduction type, a second conductive layer of a second conduction type and an interlayer, the interlayer being arranged between the first and second conductive layers and increasing the tunnelling probability for charge carriers.

The interlayer according to the invention has the advantage that the charge carrier absorption and the scattering at ionized defects are reduced in it, with the result that the charge carriers have longer lifetimes and therefore the electrical resistance is reduced. The reduced electrical resistance means that the conductive contact remains stable and is not destroyed even under extreme current loads. As a result, the service life of the diode laser arrangement is advantageously lengthened.

In one configuration of the invention, it is provided for the interlayer to be undoped. An undoped (intrinsic) layer has the advantage that the charge carrier absorption and the scattering of charge carriers at ionized defects is reduced in the immediate junction region. This extends the lifetime of the charge carriers, so that the electrical resistance of the conductive contact layer is reduced. The interlayer is advantageously designed to be relatively thin. It may have a thickness ranging between a monolayer and 50 nm.

A further arrangement according to the invention provides for the interlayer to be doped with the first or second conduction type but to have a lower dopant concentration than the first or second conductive layer.

The object according to the invention is likewise achieved by an arrangement of semiconductor diode lasers stacked on top of one another, having:
  a substrate on which a first diode laser is arranged;
  a second diode laser, which is arranged on the first diode laser;
  a contact layer which is arranged between the first diode laser and the second diode laser, in which arrangement the contact layer comprises a first conductive layer of a first conduction type, a second conductive layer of a second conduction type, a first interlayer and a second interlayer, the first and second interlayers being arranged between the first and second conductive layers, and the first interlayer facing the first conductive layer and the second interlayer facing the second conductive layer.

The first and second interlayers allow quantum phenomena, since they modify the band structure in such a way that quantum well-like modifications to the Fermi level occur. By way of example, the doping which can effectively be achieved in the first and second interlayers is increased compared to bulk material. By way of example, the increased effective doping also increases the charge carrier density, with the result that the electrical contact has a reduced contact resistance.

An advantageous configuration of the invention provides for the first interlayer to have the same conduction type as the first conductive layer but a higher dopant concentration, and for the second interlayer to have the same conduction type as the second conductive layer but a higher dopant concentration. The increased dopant concentration of the first and second interlayers makes it possible to achieve an increased charge carrier density compared to conventional pn tunnel contacts, with the result that the contact resistance of the electrical contact is reduced.

Furthermore, it is preferable for the first and/or second interlayer to have a thickness ranging between a monolayer and 30 nm, or between 4 nm and 12 nm. A thickness ranging between a monolayer and 30 nm makes it possible to form quantum well-like structures, allowing quantum phenomena which make it possible to achieve an increased effective doping and therefore an increased charge carrier density compared to conventional structures. A thickness of between 4 and 12 nm is advantageously suitable for the formation of quantum well-like structures.

The object according to the invention is also achieved by an arrangement of semiconductor diode lasers stacked on top of one another, having:
  a substrate on which a first diode laser is arranged;
  a second diode laser, which is arranged on the first diode laser;
  a contact layer which is arranged between the first diode laser and the second diode laser, in which arrangement the contact layer is formed in such a way that a lattice mismatch between the substrate and the first diode laser can be compensated for by a lattice mismatch of the opposite sign between the substrate and the contact layer.

The fact that it is possible to compensate for material stresses advantageously increases the life of the semiconductor diode laser arrangement, since stresses in the layer stack are compensated for and therefore relaxation dislocations do not occur. The reduction in lattice stresses prevents accumulation of elastic energy, with the result that the service life and electrical load-bearing capacity of the electrical contact are improved.

Furthermore, there is provision for the substrate to have a first lattice constant, for the first diode laser to have a second lattice constant and for the contact layer to have a third lattice constant, the difference formed by the second lattice constant minus the first lattice constant having the same sign as the difference formed by the first lattice constant minus the third lattice constant. The fact that the difference between the lattice constants referred to above has the same sign ensures that the stresses between substrate and diode laser are partially or completely compensated for by stresses between substrate and contact layer. If, by way of example, the laser structure has a greater lattice constant than the substrate, the contact layer should have a lower lattice constant than the substrate. If the laser structure has a lower lattice constant than the substrate, the contact layer should have a greater lattice constant than the substrate.

According to a further configuration of the invention, the contact layer contains gallium phosphide, zinc sulphide, zinc telluride, zinc sulphide telluride, zinc selenide, zinc sulphide selenide, indium gallium phosphide or indium gallium arsenic phosphide. By way of example, aluminium-gallium-indium-arsenide-nitride-phosphide is suitable. The materials mentioned are advantageously suitable for compensating for the lattice stresses between the first diode laser and the substrate by means of an opposite lattice mismatch between the contact layer and the substrate.

Further advantageous configurations form the subject matter of the corresponding subclaims.

The invention is explained in more detail below on the basis of exemplary embodiments and with reference to figures, in which identical reference symbols denote identical or functionally equivalent components.

DETAILED DESCRIPTION OF THE DRAWINGS

The description of the exemplary embodiments in each case also encompasses a corresponding complementary exemplary embodiment in which all the dopings are replaced by their complementary doping. By way of example, all the p-dopings can be replaced by n-dopings.

Figure 1:
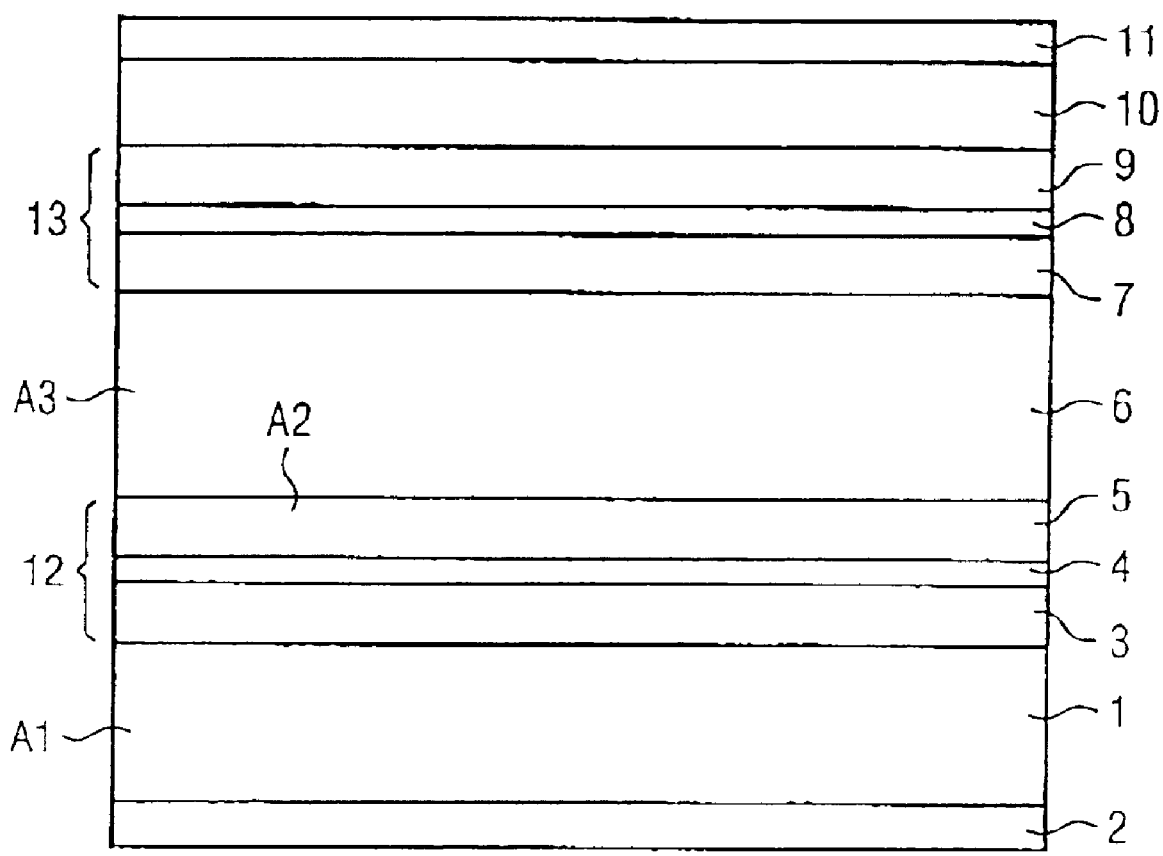
FIG. 1 diagrammatically depicts a section through a chip having a semiconductor body with two semiconductor diode lasers stacked one on top of the other.

FIG. 1 illustrates a diode laser with a substrate 1, with which contact is made by means of a first contact-making layer 2. A first diode laser 12 is arranged on the substrate 1 on a surface which is remote from the first contact-making layer 2. This first diode laser 12 comprises, for example, a first delimiting layer 3 made from n-doped aluminium gallium arsenide (n-Al$_x$Ga$_{1-x}$As) and a second delimiting layer 5 made from p-doped aluminium gallium arsenide (p-Al$_x$Ga$_{1-x}$As), between which a first active laser layer 4, which includes, for example, gallium arsenide or indium gallium arsenide, is arranged. Furthermore, the laser layer 4 may be doped with p-type or n-type dopant. The wavelength of the radiation emitted can be changed by selecting the material for the laser layer 4. The invention also encompasses lasers which consist of other materials systems comprising, for example, phosphides or selenides.

A contact layer 6 is arranged on the second delimiting layer 5. The contact layer 6 is explained in more detail in conjunction with FIGS. 3 and 4. On the contact layer 6 there is a second diode laser 13, which is of similar structure to the first diode laser 12 and comprises a third delimiting layer 7 made from n-doped aluminium gallium arsenide (n-Al$_x$Ga$_{1-x}$As), a second active laser layer 8 and a fourth delimiting layer 9 made from p-doped aluminium gallium arsenide (p-Al$_x$Ga$_{1-x}$As). A connecting layer 10 is arranged on the second diode laser 13, and a second contact-making layer 11 is arranged on the connecting layer 10.

Figure 2:
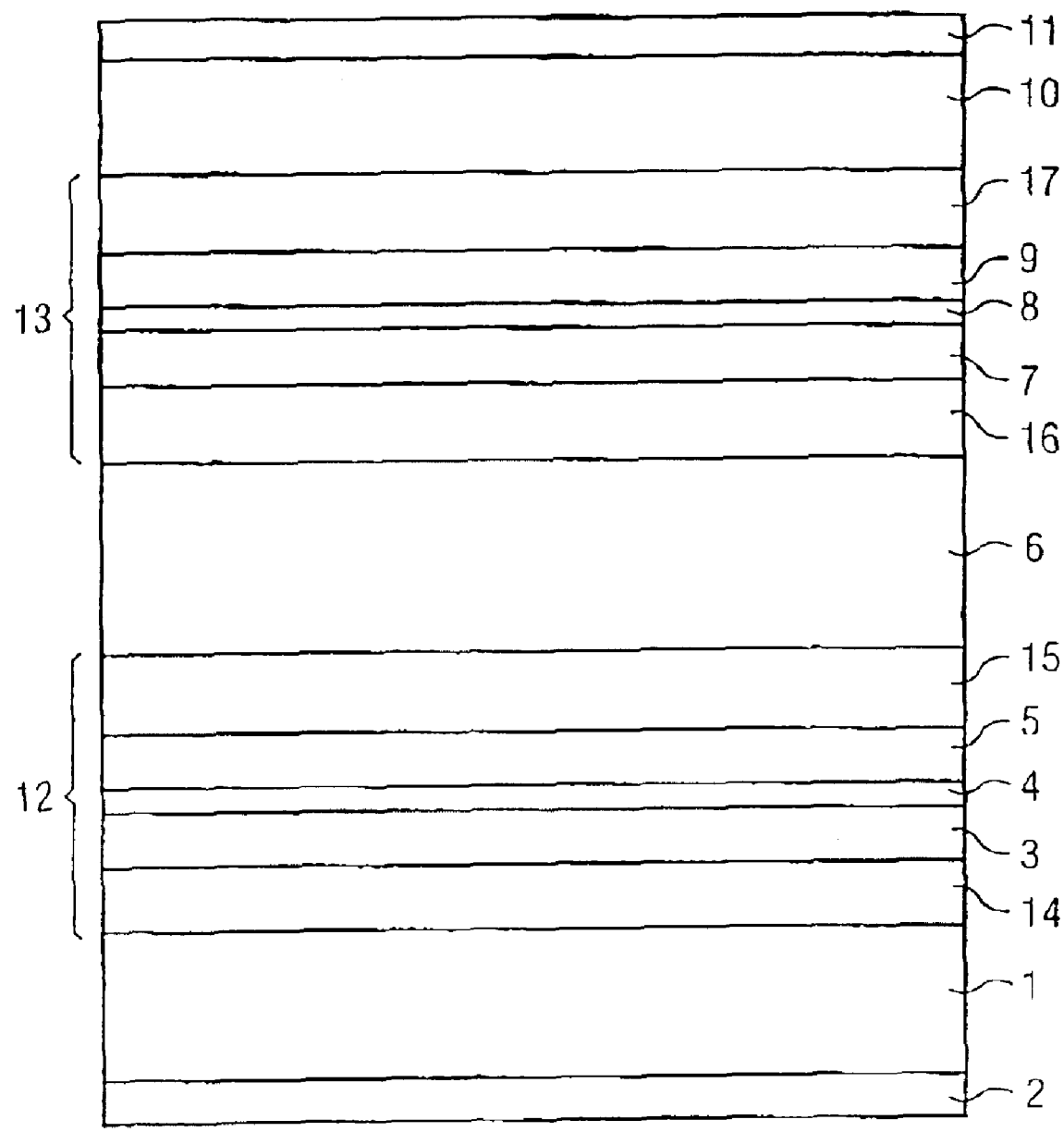
FIG. 2 shows a further diagrammatic illustration of a section through a chip having a semiconductor body with two semiconductor diode lasers stacked one on top of the other.

In the exemplary embodiment illustrated in FIG. 2, a cladding layer 14, 15, 16, 17 is in each case arranged on that side of the delimiting layers 3, 5, 7, 9 which is remote from the active laser layer 4, 8. The cladding layers promote the wave guidance in the diode lasers 12, 13. Furthermore, they can facilitate charge carrier inversion, so that the threshold for the laser is reduced.

By way of example, it is possible for the first and second cladding layers 14, 15 to have an aluminium content of approximately 30% and for the first and second delimiting layers 3, 5 to have an aluminium content of approximately 60%. This configuration leads to advantageous wave guidance in the first diode laser 12. The third and fourth cladding layers 16, 17 likewise have, for example, an aluminium concentration of 30%, and the third and fourth delimiting layers 7 and 9 likewise have, for example, an aluminium concentration of 60%. This promotes wave guidance in the second diode laser 13.

Figure 3:
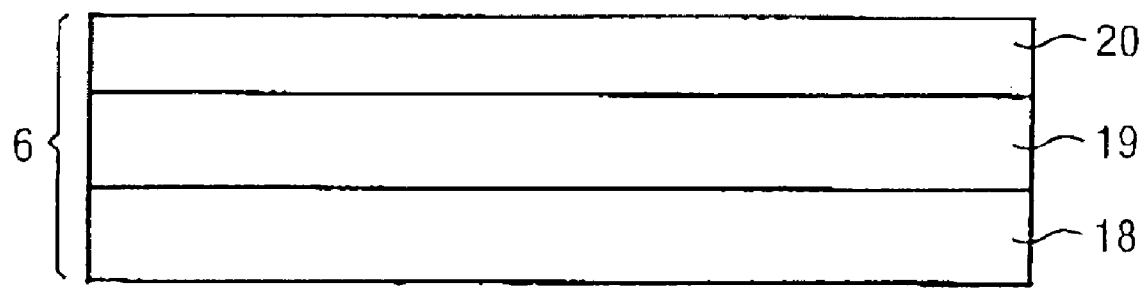
FIG. 3 diagrammatically depicts a section through a first configuration according to the invention of a contact layer between two semiconductor diode lasers stacked one above the other.

FIG. 3 illustrates the contact layer 6. The contact layer 6 comprises a first conductive layer 18, which is doped with a first dopant type. Furthermore, the contact layer 6 comprises a second conductive layer 20, which is doped with a second dopant type. The first dopant type is selected to be complementary with respect to the second dopant type. Furthermore, an interlayer 19 is arranged between the first conductive layer 18 and the second conductive layer 20. In one exemplary embodiment, the interlayer 19 is, for example, undoped, i.e. intrinsic. This has the advantage that the charge carrier absorption and the scattering of charge carriers at ionized defects in the junction region is reduced, since the number of defects is reduced. Consequently, the electrical resistance of the contact layer 6 is also reduced.

A further exemplary embodiment provides for the interlayer 19 to be doped with the first or second charge carrier type.

In this case, the dopant concentration of the interlayer 19 is selected to be lower than the dopant concentration of the first conductive layer 18 or of the second conductive layer 20.

Figure 4:
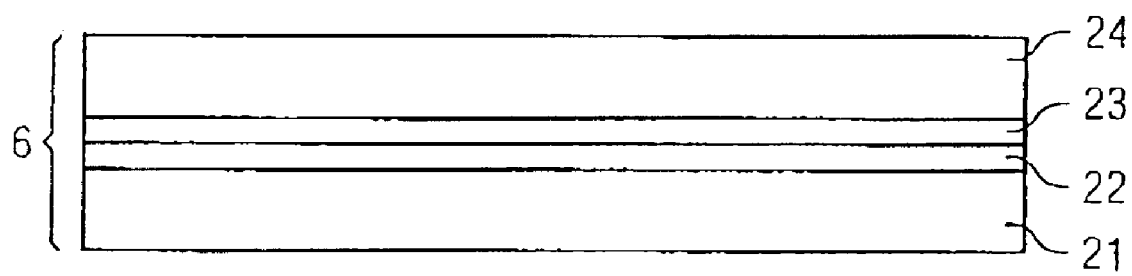
FIG. 4 diagrammatically depicts a section through a further exemplary embodiment of a contact layer according to the invention between two semiconductor diode lasers stacked one above the other.

A further exemplary embodiment of the contact layer 6 is illustrated in FIG. 4. In this case, the contact layer 6 comprises a first conductive layer 21, a first interlayer 22, which is arranged on the conductive layer 21, a second interlayer 23, which is arranged on the first interlayer 22, and a second conductive layer 24, which is arranged on the second interlayer 23. By way of example, the first conductive layer 21 is a p-doped gallium arsenide layer or aluminium gallium arsenide layer. Furthermore, the first interlayer 22 is a highly p-doped gallium arsenide layer and the second interlayer 23 is a highly n-doped gallium arsenide layer. The second conductive layer 24 is, for example, an n-doped gallium arsenide layer. Furthermore, the following materials are suitable for the first conductive layer 21, the first interlayer 22, the second interlayer 23 and the second conductive layer 24. By way of example, the first conductive layer 21, the first interlayer 22, the second interlayer 23 and the second conductive layer 24 may contain indium gallium aluminium arsenide.

If the first interlayer 22 and the second interlayer 23 are formed with a thickness ranging between a monolayer and 50 nm—i.e. for example of 10 nm—quantum well-like structures which can be doped more highly than bulk material are formed. This results in an increased charge carrier density, which leads to an increased tunnelling probability and therefore to a reduced contact resistance.

The description of the exemplary embodiment is not to be understood as constituting any restriction to gallium arsenide. The layer sequence may also be correspondingly replaced by gallium nitride, zinc selenide or zinc telluride or by a compound corresponding to the general formula (Zn, Mg, Cd) (S, Se, Te), in which the amounts of the individual constituents may also be zero.

With regard to FIG. 1, a further configuration of the invention provides for the substrate 1 to have a first lattice constant A1, for the first diode laser 12 to have a second, average lattice constant A2 and for the contact layer 6 to have a third lattice constant A3. If, by way of example, the diode laser is subject to compressive stresses from the substrate, the energy stored by the stresses is at least partially reduced through the structure as a whole if the contact layer is subject to tensile stresses from the substrate. In this context, it is advantageous for the contact layer to have a lower lattice constant than the substrate if the laser has a higher lattice constant than the substrate. Conversely, it is advantageous for the contact layer to have a higher lattice constant than the substrate if the laser has a lower lattice constant than the substrate. This weakens the stresses in the diode laser 12 including contact layer caused by the lattice mismatch with respect to the substrate 1. In a corresponding way, the force produced by a tensile lattice mismatch can be partially compensated for. Accordingly, compensation occurs if the difference formed by the second lattice constant A2 minus the first lattice constant A1 has the same sign as the difference formed by the first lattice constant A1 minus the third lattice constant A3.

The scope of protection of the invention is not limited to the examples given herein above. The invention is embodied in each novel characteristic and each combination of characteristics, which includes every combination of any features which are stated in the claims, even if this combination of features is not explicitly stated in the claims. All contents of the priority document are herewith included by reference.

What is claimed is:

1. An arrangement of semiconductor diode lasers stacked on top of one another, comprising:
   a substrate on which a first diode laser is arranged;
   a second diode laser which is arranged on the first diode laser;
   a contact layer which is arranged between the first diode laser and the second diode laser;
   wherein the contact layer comprises a first conductive layer of a first conduction type, a second conductive layer of a second conduction type and an interlayer which is arranged between the first and second conductive layers for increasing a tunneling probability for charge carriers, and wherein the-interlayer is undoped.

2. An arrangement of semiconductor diode lasers stacked on top of one another, comprising:
   a substrate on which a first diode laser is arranged;
   a second diode laser which is arranged on the first diode laser;
   a contact layer which is arranged between the first diode laser and the second diode laser;
   wherein the contact layer comprises a first conductive layer of a first conduction type, a second conductive layer of a second conduction type and an interlayer which is arranged between the first and second conductive layers for increasing a tunneling probability for charge carriers, and wherein the interlayer is doped with the first or second conduction type but has a lower dopant concentration than the first conductive layer or the second conductive layer.

3. An arrangement of semiconductor diode lasers stacked on top of one another, having:
   a substrate on which a first diode laser is arranged;
   a second diode laser which is arranged on the first diode laser; and
   a contact layer which is arranged between the first diode laser and the second diode laser;
   wherein the contact layer comprises a first conductive layer of a first conduction type, a second conductive layer of a second conduction type, a first interlayer and a second interlayer, the first and second interlayers being arranged between the first and second conductive layers, and the first interlayer facing the first conductive layer and the second interlayer facing the second conductive layer.

4. The arrangement according to claim 3, wherein the first interlayer has the same conduction type as the first conductive layer but a higher dopant concentration, and the second interlayer has the same conduction type as the second conductive layer but a higher dopant concentration.

5. The arrangement according to claim 3, wherein the first or the second interlayer has a thickness ranging between a monolayer and 30 nm.

6. The arrangement according to claim 3, wherein the first or second interlayer has a thickness of between 4 and 12 nm.

7. An arrangement of semiconductor diode lasers stacked on top of one another, having:
   a substrate on which a first diode laser is arranged;
   a second diode laser which is arranged on the first diode laser; and
   a contact layer which is arranged between the first diode laser and the second diode laser;
   wherein the contact layer is formed such that a lattice mismatch between the substrate and the first diode laser can be compensated for by a lattice mismatch of opposite sign between the substrate and the contact layer.

8. The arrangement according to claim 7, wherein the substrate has a first lattice constant (A1), the first diode laser has a second lattice constant (A2) and the contact layer has a third lattice constant (A3), the difference formed by the second lattice constant (A2) minus the first lattice constant (A1) having the same sign as the difference formed by the first lattice constant (A1) minus the third lattice constant (A3).

9. The arrangement according to claim 7, wherein the contact layer contains gallium phosphide, zinc sulphide, zinc telluride, zinc sulphide telluride, zinc selenide, zinc suiphide selenide, indium gallium phosphide or indium gallium arsenic phosphide.

* * * * *

UNITED STATES PATENT AND TRADEMARK OFFICE
CERTIFICATE OF CORRECTION

| | | |
|---|---|---|
| PATENT NO. | : 6,956,881 B2 | Page 1 of 1 |
| APPLICATION NO. | : 10/432187 | |
| DATED | : October 18, 2005 | |
| INVENTOR(S) | : Martin Behringer et al. | |

It is certified that error appears in the above-identified patent and that said Letters Patent is hereby corrected as shown below:

Col. 6, line 50, replace the expression "opposite sign" with -- an opposite sign --

Col. 6, line 62, replace the expression "zinc suiphide" with -- zinc sulphide --

Signed and Sealed this

Twenty-second Day of March, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 6,956,881 B2 | |
| APPLICATION NO. | : 10/432187 | |
| DATED | : October 18, 2005 | |
| INVENTOR(S) | : Martin Behringer | |

It is certified that error appears in the above-identified patent and that said Letters Patent is hereby corrected as shown below:

Title Page
Item (73) Assignee: should read as:   OSRAM GmbH
                                      Munich (DE)

Signed and Sealed this
Second Day of August, 2011

David J. Kappos
*Director of the United States Patent and Trademark Office*